(12) United States Patent
Heuck et al.

(10) Patent No.: US 9,593,012 B2
(45) Date of Patent: Mar. 14, 2017

(54) METHOD FOR PRODUCING A MICROMECHANICAL COMPONENT, AND CORRESPONDING MICROMECHANICAL COMPONENT

(71) Applicant: Robert Bosch GmbH, Stuttgart (DE)

(72) Inventors: Friedjof Heuck, Stuttgart (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/774,799

(22) PCT Filed: Mar. 12, 2014

(86) PCT No.: PCT/EP2014/054876
§ 371 (c)(1),
(2) Date: Sep. 11, 2015

(87) PCT Pub. No.: WO2014/140120
PCT Pub. Date: Sep. 18, 2014

(65) Prior Publication Data
US 2016/0023895 A1 Jan. 28, 2016

(30) Foreign Application Priority Data

Mar. 14, 2013 (DE) .................. 10 2013 204 475

(51) Int. Cl.
*B81C 1/00* (2006.01)
(52) U.S. Cl.
CPC ...... *B81C 1/00619* (2013.01); *B81C 1/00412* (2013.01); *B81C 2201/0177* (2013.01); *B81C 2201/0188* (2013.01)

(58) Field of Classification Search
None
See application file for complete search history.

(56) References Cited

U.S. PATENT DOCUMENTS

| 2002/0180306 A1 | 12/2002 | Hunt et al. |
| 2003/0049878 A1 | 3/2003 | Offenberg et al. |

(Continued)

FOREIGN PATENT DOCUMENTS

| CN | 100500950 C | 6/2009 |
| CN | 100579892 C | 1/2010 |
| CN | 101837944 A | 9/2010 |

OTHER PUBLICATIONS

International Search Report corresponding to PCT Application No. PCT/EP2014/054878, mailed Jun. 24, 2014 (German and English language document) (7 pages).

(Continued)

*Primary Examiner* — Asok K Sarkar
(74) *Attorney, Agent, or Firm* — Maginot, Moore & Beck LLP

(57) ABSTRACT

A method for producing a micromechanical component includes providing a substrate with a monocrystalline starting layer which is exposed in structured regions. The structured regions have an upper face and lateral flanks, wherein a catalyst layer, which is suitable for promoting a silicon epitaxial growth of the exposed upper face of the structured monocrystalline starting layer, is provided on the upper face, and no catalyst layers are provided on the flanks. The method also includes carrying out a selective epitaxial growth process on the upper face of the monocrystalline starting layer using the catalyst layer in a reactive gas atmosphere in order to form a micromechanical functional layer.

18 Claims, 6 Drawing Sheets

(56) References Cited

U.S. PATENT DOCUMENTS

| | | |
|---|---|---|
| 2004/0248344 A1 | 12/2004 | Partridge et al. |
| 2008/0099860 A1* | 5/2008 | Wuertz ............... B81C 1/00246 257/415 |
| 2008/0188064 A1 | 8/2008 | Samuelson et al. |
| 2009/0085426 A1 | 4/2009 | Davis et al. |
| 2009/0191660 A1 | 7/2009 | Christenson et al. |
| 2012/0090057 A1 | 4/2012 | Cohen et al. |
| 2013/0260113 A1* | 10/2013 | Hart .................. B32B 3/22 428/201 |

OTHER PUBLICATIONS

Schmidt et al.; Growth, Thermodynamics, and Electrical Properties of Silicon Nanowires; Chemical Reviews; Jan. 13, 2010; pp. 361-388; vol. 110, Issue No. 1; American Chemical Society.

Kolasinski; Catalytic growth of nanowires: Vapor-liquid-solid, vapor-solid-solid, solution-liquid-solid and solid-liquid-solid growth; Current Opinion in Solid State and Materials Science; 2006; pp. 182-191; ScienceDirect, www.sciencedirect.com.

\* cited by examiner

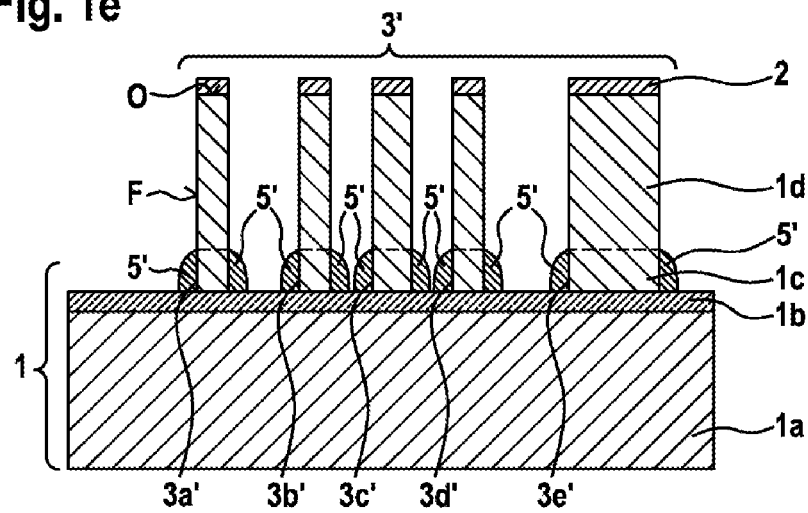
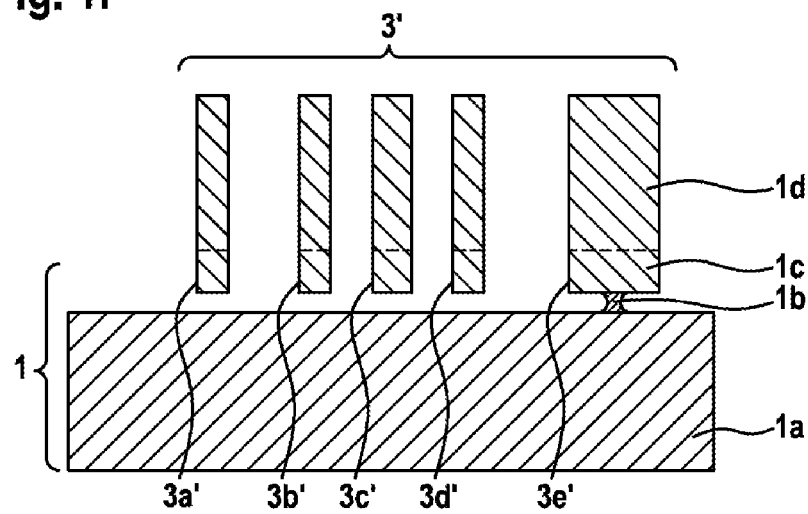

METHOD FOR PRODUCING A MICROMECHANICAL COMPONENT, AND CORRESPONDING MICROMECHANICAL COMPONENT

This application is a 35 U.S.C. §371 National Stage Application of PCT/EP2014/054876, filed on Mar. 12, 2014, which claims the benefit of priority to Serial No. DE 10 2013 204 475.5, filed on Mar. 14, 2013 in Germany, the disclosures of which are incorporated herein by reference in their entireties.

The present disclosure relates to a production method for a micromechanical component, and a corresponding micromechanical component.

BACKGROUND

Superficial micro-mechanically produced MEMS structures having high aspect ratios are generally produced by structuring thick layers, for example, polysilicon layers, by means of a DRIE (dry reactive ionic etching) etching process. However, this procedure has special properties for MEMS components having structural elements which are driven in the plane and suspended via spring elements. Because of the construction of the DRIE etching facilities, the structures no longer have symmetrical cross sections toward the wafer edge, but rather are distorted like parallelograms. As a result, an undesired movement torque out of the plane can arise, which possibly has an effect on the functionality.

For example, the correction, which is required due to the parallelogram-type distortion in rotation rate sensors in the MEMS and ASIC designs, requires a high degree of complexity and chip surface. This is primarily expressed in the so-called quadrature compensation. The quadrature is an error signal which is coupled into the detection by the drive of the rotation rate sensor. This compensation requires providing voltages greater than 10 V, which can only be provided by the ASIC in a manner linked to high costs.

In addition, presently the functional layers frequently consist of polycrystalline silicon layers. The grain sizes are in the order of magnitude of the lateral spring widths in this case, which has the result that individual grains and the crystal orientation thereof can strongly influence the mechanical behavior of individual spring suspensions in the ranges of stress maxima.

Vapor-liquid-solid or vapor-solid-solid methods for selectively growing monocrystalline layers are known, for example, from "Growth, Thermodynamics, and Electrical Properties of Silicon Nanowires", V. Schmidt, J. V. Wittemann, and U. Gösele in Chem. Ref. 2010, 110, pages 361 to 388 and from "Catalytic Growth of Nanowires: Vapor-Liquid-Solid, Vapor-Solid-Solid, Solution-Liquid-Solid and Solid-Liquid-Solid Growth", K. W. Kolasinski, Current Opinion in Solid State and Materials Science 10 (2006), pages 182 to 191.

SUMMARY

The present disclosure provides a production method for a micromechanical component as described in the following description and a corresponding micromechanical component as described in the following description.

Preferred refinements are the subject matter of the following description.

The fundamental idea of the present disclosure is to, instead of subtractively removing material of a micromechanical functional layer, which was previously deposited over the entire area, in a DRIE step, to structure the material in a precursor step as a starting layer and subsequently to grow it additively in a crystalline and selective manner, controlled by a catalyst layer. The present disclosure therefore enables monocrystalline MEMS structures having symmetrical cross sections to be produced over an entire wafer in a selective manner.

In particular, symmetrical profile cross sections for micromechanical springs in inertial sensors are producible by the method according to the disclosure. For rotation rate sensors, an asymmetry of 0.5° in the flank angles of the suspension springs already results in an undesired mode excitation. By ensuring a starting layer which is incorrectly oriented by less than, for example, 0.5°—ideally less than 0.1°—from the low-index crystal plane, the interfering mode excitation for specific sensors can be significantly improved.

This results in a reduction of the quadrature, whereby a smaller and therefore more cost-effective ASIC is usable as a result of the omission of the high-voltage option in the circuit. Higher aspect ratios in both the structures and also the distances are achievable by way of the method according to the disclosure in comparison to known subtractive DRIE methods. Smaller gap distances for micromechanical detection electrodes are also implementable. Because of the deposition of monocrystalline structures, grain boundaries do not form, which results in greatly restricted scattering of the modulus of elasticity of the relevant micromechanical structures. The method according to the disclosure additionally enables deposition in a batch process, in contrast to the known single-wafer DRIE structuring.

A potential cost advantage also results due to the structuring of a thin monocrystalline starting layer and subsequent selective growth in relation to the known methods, which are based on deposition of a thick functional layer and subsequent structuring thereof using DRIE.

According to a preferred embodiment, the starting layer consists of monocrystalline material, in particular silicon. This has the advantage that silicon technology is well controlled and mature.

According to a further preferred embodiment, the upper side has a tilt of less than 0.5° in relation to a low-index crystal plane, in particular the (111) plane. This has proven to be particularly advantageous for specific sensor applications.

According to a further preferred embodiment, the substrate is an SOI substrate having a first silicon layer, an oxide layer, and the starting layer. This is a particularly favorable starting point, since such SOI wafers are available in very good quality on the market.

According to a further preferred embodiment, the upper sides extend substantially flatly and the flanks extend substantially vertically in relation to the upper side. This is an advantageous geometry for many applications.

According to a further preferred embodiment, the starting layer and the catalyst layer are firstly provided unstructured one on top of another and are subsequently jointly structured by an etching process. A small number of process steps may thus be achieved.

According to a further preferred embodiment, the starting layer is firstly structured without the catalyst layer and subsequently the catalyst layer is formed on the upper side and structured. This alternative is also feasible very cost-effectively.

According to a further preferred embodiment, spacers are formed on the flanks before the performance of the selective growth process. The spacers ensure structurally accurate imaging during the later growth process, because they prevent, for example, contraction of a liquid phase due to capillary effects in convex corners.

According to a further preferred embodiment, the catalyst layer is formed from one of the elements of the 4th to 15th main groups of the periodic system. These elements are very well suited to VLS or VSS growth.

According to a further preferred embodiment, spacers are formed on the flanks before the formation of the catalyst layer, and the catalyst layer is subsequently deposited thereon, wherein the catalyst layer reacts with the upper side and does not react with the spacers, and the unreacted part of the catalyst layer is finally selectively removed from the spacers. The spacers can thus fulfill a double function.

According to a further preferred embodiment, a silane-containing gas atmosphere is used during the performance of the selective growth process, in particular at a temperature of greater than 600° C. In this way, particularly effective growth may be achieved.

According to a further preferred embodiment, the micromechanical functional layer is under-etched by a sacrificial etching layer. Inertial sensors may thus be formed, for example.

According to a further preferred embodiment, the catalyst layer is removed after the performance of the selective growth process. This can be advantageous if further functional elements are to be formed in planes which lie above it.

BRIEF DESCRIPTION OF THE DRAWINGS

The present disclosure will be explained in greater detail hereafter on the basis of exemplary embodiments indicated in the schematic figures of the drawings. In the figures.

DETAILED DESCRIPTION

In the figures, identical reference signs identify identical or functionally identical elements.

Figure 1A:
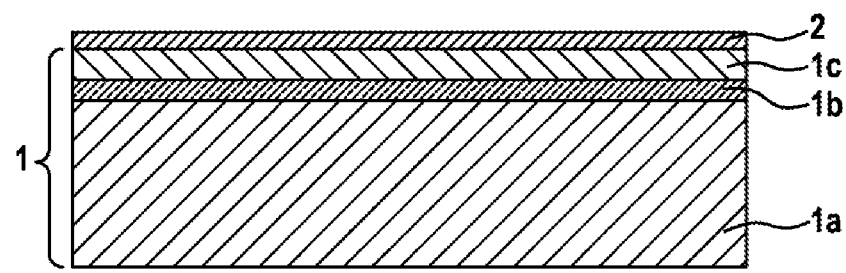
FIGS. 1a)-f) show schematic cross-sectional illustrations to explain a micromechanical component and a corresponding production method according to a first embodiment of the present disclosure.

FIGS. 1a)-f) show schematic cross-sectional illustrations to explain a micromechanical component and a corresponding production method according to a first embodiment of the present disclosure.

In FIGS. 1a) to e), reference sign 1 identifies an SOI substrate having a first silicon layer 1a, an oxide layer 1b located on the first silicon layer 1a, and a second monocrystalline silicon layer 1c located on the oxide layer 1b.

The monocrystalline silicon layer 1c is formed in the present example as a (111) crystal plane. According to FIG. 1a), a catalyst layer 2, which comprises, for example, Zn, Ag, Al, Cu, Au, Ni, or Pt, is formed on the monocrystalline silicon layer 1c.

In principle, numerous metallic elements of the periodic system are known to come into consideration as catalysts for VLS (vapor-liquid-solid) or VSS (vapor-solid-solid) growth of silicon.

Some of these catalysts form a solid or liquid silicide in this case, and others form a silicon eutectic material. The catalysts ideally have the following properties. Firstly, they promote a high growth rate by way of the high solubility thereof for silicon or by way of the low activation energy thereof for the growth. Secondly, they are ideally compatible with CMOS processes, so that the processing can be performed in known semiconductor technology. Thirdly, they have a low vapor pressure, so that the catalyst is not vaporized during the growth. In particular the use of solid silicides promises a high structural accuracy, since therefore structures can be designed and produced independently of surface tensions of the liquid silicides.

On the basis of these specified requirements, in particular, but not exclusively, the above-mentioned metals Zn, Ag, Al, Cu, Au, Ni, and Pt are of interest for forming the catalyst layer 2, but the disclosure is not restricted thereto, but rather in principle all elements of the 4th to 15th main groups of the periodic system can be used for this purpose.

During the deposition of the catalyst layer 2 on the monocrystalline silicon layer 1c, the catalyst metal reacts with the silicon located underneath, i.e., for example, to form a corresponding silicide.

Figure 1B:
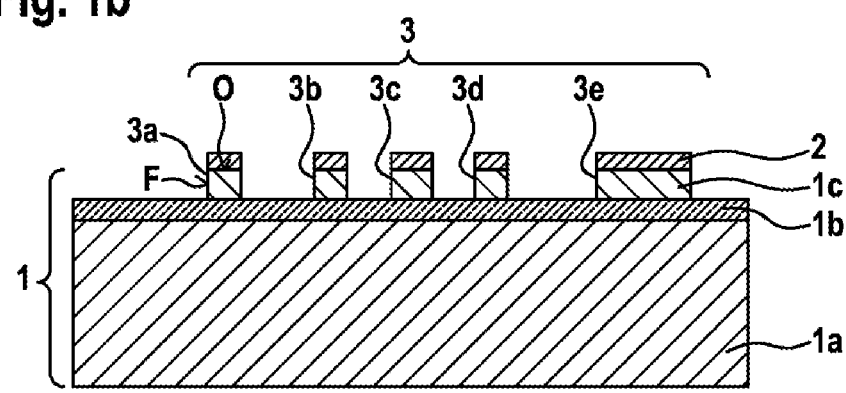

In a following process step, which is illustrated in FIG. 1b), a step of jointly structuring the catalyst layer 2 and the monocrystalline silicon layer located underneath is performed in structure regions 3a to 3e, wherein the latter therefore forms a starting layer having a precursor structure 3 of a micromechanical functional layer 3' to be formed later therefrom by selective additive growth (cf. FIG. 1e)). The structuring is preferably performed by means of an etching process, which stops at the oxide layer 1b.

As is apparent from FIG. 1b), after the etching step, an upper side O of the structured monocrystalline silicon layer 1c is covered with the catalyst layer 2, while in contrast the flanks F of the structure regions 3a to 3e of the structured monocrystalline polysilicon layer 1c are not covered thereby.

Figure 1C:
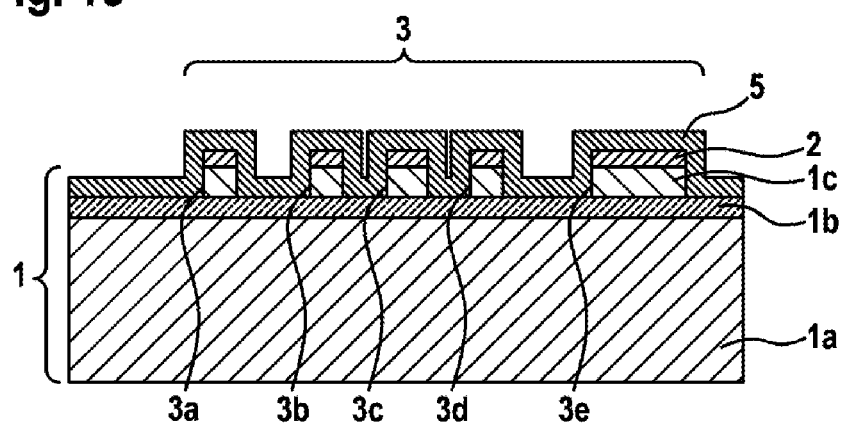

Furthermore, with reference to FIG. 1c), a further oxide layer 5 is deposited over the structured monocrystalline polysilicon layer 1c having the catalyst layer 2 located on the upper side O.

Figure 1D:
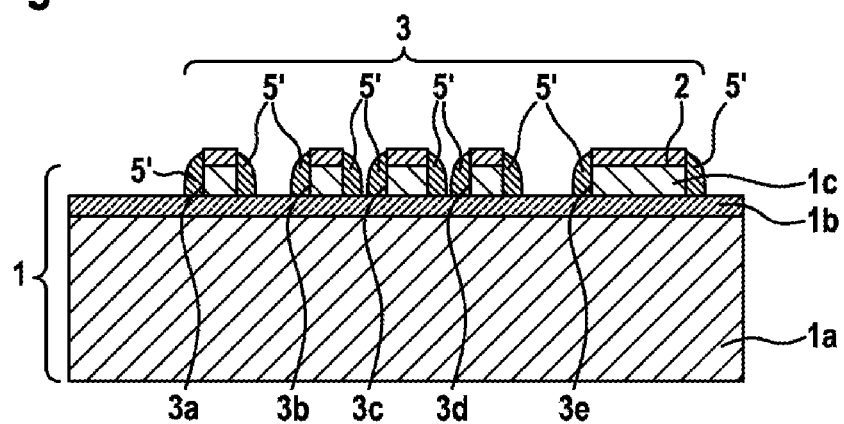

In a subsequent process step, which is illustrated in FIG. 1d), dry back-etching of the oxide layer 5 is performed by way of a dry etching process, whereby spacers 5' arise from oxide on the flanks of the structure regions 3a to 3e.

The oxide spacers 5' ensure structurally accurate imaging during the later growth process, because they prevent, for example, contraction of a liquid phase due to capillary effects in convex corners. However, they can also be omitted under certain circumstances in dependence on the deposition process and material used.

Then, with reference to FIG. 1e), a selective growth process is performed on the upper side O of the structure regions 3a to 3e of the structured monocrystalline silicon layer 1c by means of the catalyst layer 2 in a reactive gas atmosphere, whereby vertical growth and substantially no width growth of the structure regions 3a to 3e occurs. A micromechanical functional layer 3' having structure regions 3a' to 3e' made of monocrystalline silicon is thus formed on the oxide layer 1b and under the catalyst layer 2.

During the performance of the selective growth process, preferably a silane-containing gas atmosphere (for example, having dichlorosilane) at a temperature of greater than 600° C. is used. The fact that no silicon growth results on the flanks F is because a thermodynamic equilibrium forms between a deposition process and an etching process on the flanks F.

The VLS or VSS growth of structure flanks takes place completely symmetrically in relation to the crystal planes. This is because the surface and therefore the flanks of the structures grown using the VLS or VSS methods are oriented to thermodynamically favorable crystal surfaces. The incorrect orientation between the two flank angles of structures grown using the VLS or VSS method is therefore directly provided in a good approximation by the incorrect orientation of the starting layer in the form of the monocrystalline silicon layer 1c.

Finally, with reference to FIG. 1f), sacrificial layer etching is performed, for example, by means of HF gas-phase etching, to remove the oxide layer 1b, which is used as the sacrificial layer, in regions, so that the structure regions 3a', 3b', 3c', and 3d' above the first silicon layer 1a are made movable, while in contrast the structure region 3e' above a remaining part of the oxide layer 1b remains connected to the first silicon layer 1a as an anchor. A micromechanical functional layer 3' formed in this manner is, for example, an anchored spring structure as a component of an inertial sensor, in particular a rotation rate sensor.

With respect to the catalyst layer 2, it is to be mentioned that it, as shown in the present exemplary embodiment, can optionally be removed by means of ion beam etching or plasma etching. However, there can also be applications in which the catalyst layer 2 can be left on the micromechanical functional layer 3'.

Figure 2A:
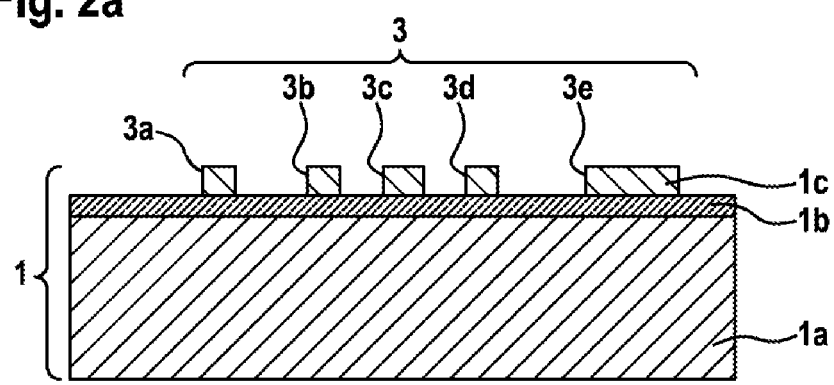
FIGS. 2a)-f) show schematic cross-sectional illustrations to explain a micromechanical component and a corresponding production method according to a second embodiment of the present disclosure.

FIGS. 2a)-f) show schematic cross-sectional illustrations to explain a micromechanical component and a corresponding production method according to a second embodiment of the present disclosure.

In the second embodiment, in contrast to the first embodiment, firstly the monocrystalline silicon layer 1c is structured in an etching process in the structure regions 3a to 3e of the precursor structure 3 without catalyst layer 2 located thereon, as shown in FIG. 2a).

Figure 2B:
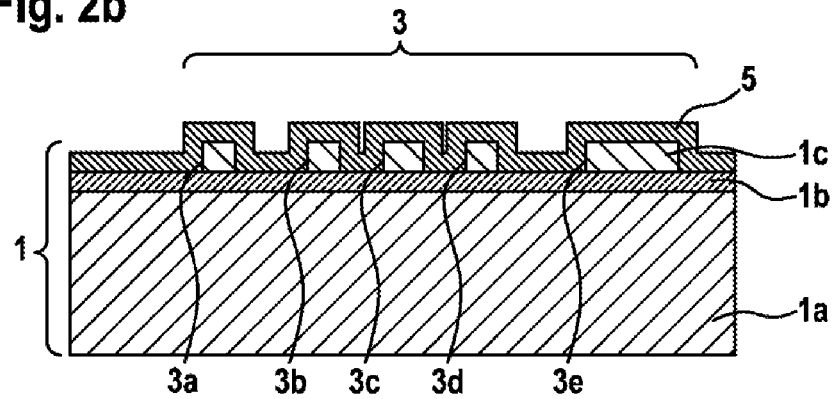

Subsequently, with reference to FIG. 2b), a further oxide layer 5 is deposited above the monocrystalline silicon layer 1c, which is structured in the structure regions 3a to 3e.

Figure 2C:
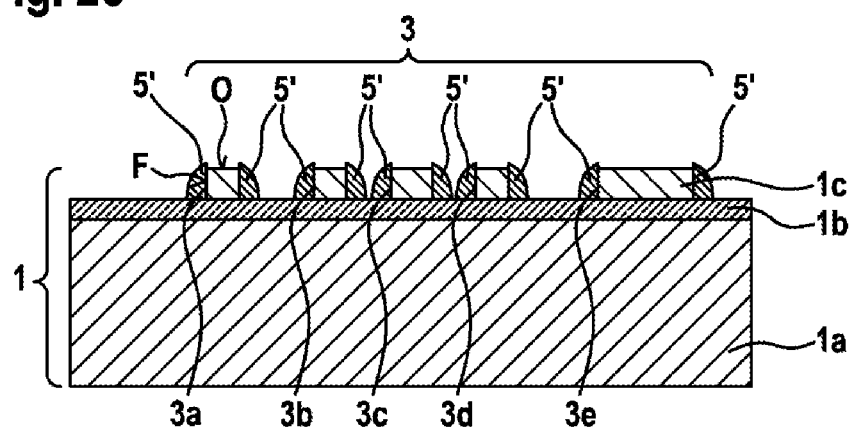

Spacers 5' made of oxide may be generated on the flanks F of the structure regions 3a to 3e by way of oriented back-etching of the oxide layer 5, while in contrast the upper side O remains uncovered by the oxide, as shown in FIG. 2c).

Figure 2D:
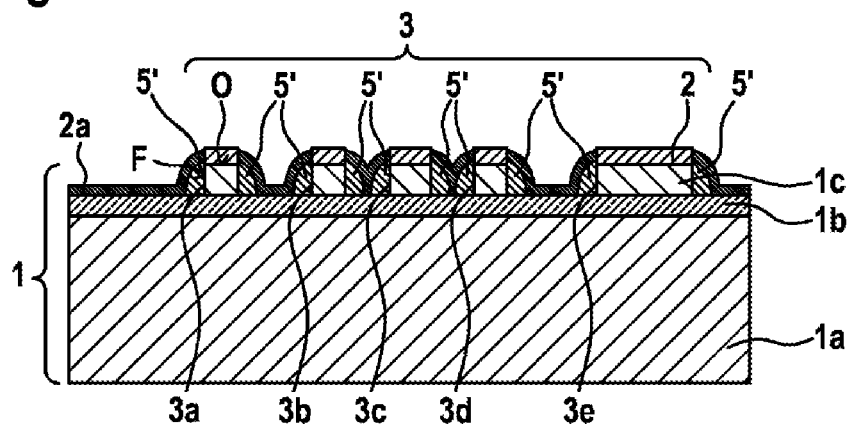

As furthermore shown with reference to FIG. 2d), subsequently the catalyst layer 2 is formed above the structured monocrystalline silicon layer 1c having the spacers 5' by depositing the catalyst metal at a corresponding temperature, wherein the catalyst layer 2 reacts with the exposed upper side O, but not with the spacers 5' made of oxide or the oxide layer 1b. Thus, in a further process step (not shown), the unreacted part of the catalyst layer may be selectively removed from the spacers 5' and the oxide layer 1b, which results in a process state similar to FIG. 1b).

Figure 2E:
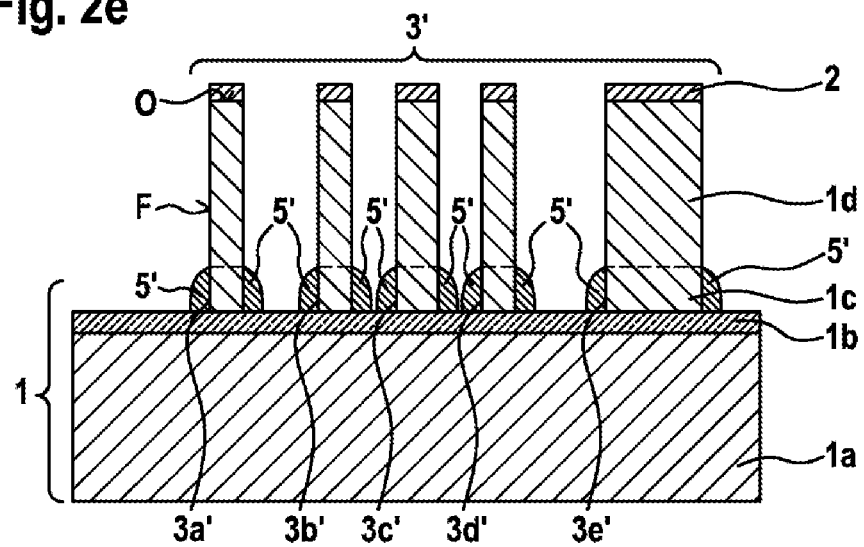
Figure 2F:
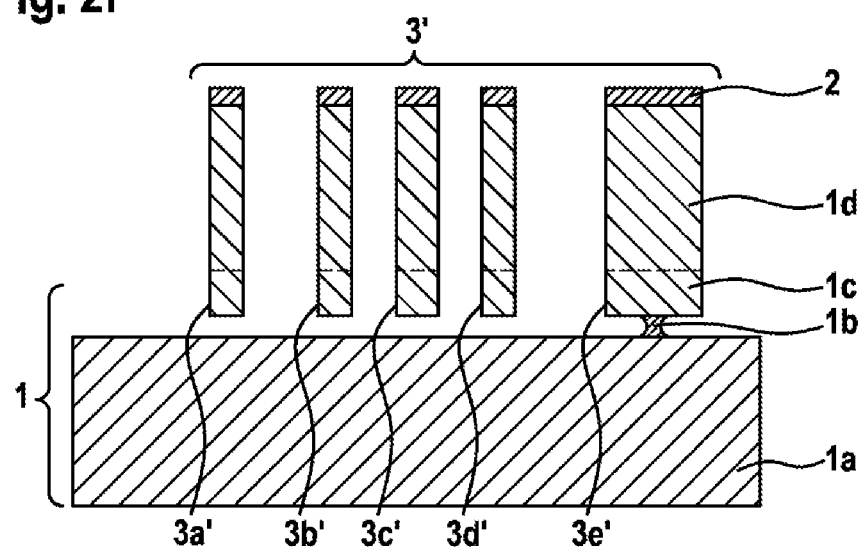

As shown in FIG. 2e), similarly to the first embodiment, the selective growth process is performed to form the micromechanical functional layer 3' from the monocrystalline silicon layer 1c having the structure regions 3a to 3e.

In the present exemplary embodiment, sacrificial layer etching is also performed similarly to the above first exemplary embodiment, but the catalyst layer 2 remains on the micromechanical functional layer 3'. The catalyst layer 2 can therefore either be used to reduce the electrical resistance and/or as a eutectic bonding metal layer for a sensor cap on the micromechanical functional layer 3'.

Although the present disclosure was described above entirely on the basis of preferred exemplary embodiments, it is not restricted thereto, but rather is modifiable in a variety of ways.

In particular, the specified materials and structures are only specified as examples and not as restrictive.

The method according to the disclosure is suitable, as noted, in particular for preparing structures which are symmetrical in cross section, in particular spring structures, in MEMS components having an asymmetry of less than 0.5°. Such structures are used in particular in methods for producing inertial sensors, in particular rotation rate sensors. However, it is generally applicable to any arbitrary micromechanical functional structures.

The invention claimed is:

1. A production method for a micromechanical component, comprising:
   forming a catalyst layer on an upper side of a silicon on insulator substrate, the catalyst layer suitable for promoting silicon growth of the upper side, the substrate including a first silicon layer, an oxide layer, and a starting layer that has exposed structure regions, the structure regions defined by the upper side and lateral flanks, with no catalyst layer formed on the lateral flanks;
   performing a selective growth process on the upper side of the exposed structure regions of the starting layer via the catalyst layer in a reactive gas atmosphere to form a micromechanical functional layer; and
   removing at least a portion of the oxide layer of the substrate via sacrificial layer etching such that at least a portion of the micromechanical functional layer is movable relative to the substrate.

2. The production method as claimed in claim 1, wherein the starting layer is monocrystalline.

3. The production method as claimed in claim 2, wherein the starting layer consists of monocrystalline silicon.

4. The production method as claimed in claim 1, wherein the upper side has a tilt of less than 0.5° in relation to a low-index crystal plane.

5. The production method as claimed in claim 4, wherein the upper side has a tilt of less than 0.5° in relation to the (111) plane.

6. The production method as claimed in claim 1, wherein the upper side extends substantially flatly and the lateral flanks extend substantially vertically in relation to the upper side.

7. The production method as claimed in claim 1, further comprising:
   providing a planar unstructured starting layer that defines the upper side of the substrate;
   forming a planar unstructured catalyst layer on the upper side of the substrate so that the planar unstructured catalyst layer is on top of the planar unstructured starting layer; and
   jointly structuring the planar unstructured catalyst layer and the planar unstructured starting layer via an etching process to form the structure regions of the starting layer and to form the catalyst layer, with portions of the catalyst layer on the upper side of the structure regions.

8. The production method as claimed in claim 1, wherein the catalyst layer is formed over the structure regions of the starting layer,
   the method further comprising structuring the formed catalyst layer such that portions of the catalyst layer are on the upper side of the structure regions and such that no portions of the catalyst layer remain on the lateral flanks.

9. The production method as claimed in claim 8, further comprising:
   forming spacers on the lateral flanks before forming the catalyst layer;
   subsequently depositing the catalyst layer such that the catalyst layer reacts with the upper side and does not react with the spacers; and
   selectively removing the unreacted part of the catalyst layer from the spacers.

10. The production method as claimed in claim 1, further comprising forming spacers on the lateral flanks before performing the selective growth process.

11. The production method as claimed in claim 1, wherein the catalyst layer is formed from an element of one of periodic table groups four through fifteen.

12. The production method as claimed in claim 1, wherein a silane-containing gas atmosphere is used for performing the selective growth process.

13. The production method as claimed claim 12, wherein a silane-containing gas atmosphere is used for performing the selective growth process at a temperature of greater than 600° C.

14. The production method as claimed in claim 1, further comprising removing the catalyst layer after performing the selective growth process.

15. A micromechanical component, comprising:
   a substrate that includes:
      a first silicon layer; and
      an oxide layer; and
   a micromechanical functional layer that has exposed structure regions defined by an upper side and lateral flanks, the micromechanical functional layer formed by selectively growing structure regions which were disposed on the oxide layer, the selective growing including vertical growth and substantially no width growth of the structure regions;
   wherein at least a portion of the oxide layer is under-cut relative to the micromechanical functional layer such that at least a portion of the micromechanical functional layer is movable relative to the substrate.

16. The micromechanical component as claimed in claim 15, wherein the functional layer is a component of an inertial sensor.

17. The micromechanical component as claimed in claim 16, wherein the functional layer is a component of a rotation rate sensor.

18. A method of producing a micromechanical component, comprising:
   forming a planar unstructured catalyst layer on an upper side of a planar unstructured starting layer of a substrate;
   jointly etching the planar unstructured catalyst layer and the planar unstructured starting layer via an etching process to form:
      a plurality of structure regions that define a structured starting layer, each structure region defined by the upper side and respective lateral flanks; and
      a plurality of catalyst portions that define a structured catalyst layer, each catalyst portion disposed on the upper side of a respective structure region, wherein no portions of the catalyst layer are disposed on the lateral flanks of the structure regions; and
   selectively growing the upper side of the structure regions of the starting layer via the respective catalyst portions in a reactive gas atmosphere to form a micromechanical functional layer.

* * * * *